(12) United States Patent
Kuo et al.

(10) Patent No.: US 10,985,709 B2
(45) Date of Patent: Apr. 20, 2021

(54) SYSTEMS AND METHODS FOR SUPPRESSING AND MITIGATING HARMONIC DISTORTION IN A CIRCUIT

(71) Applicant: Taiwan Semiconductor Manufacturing Co., Ltd., Hsin-Chu (TW)

(72) Inventors: Feng-Wei Kuo, Hsinchu County (TW); Kai Xu, Dongying (CN); Robert Bogdan Staszewski, Dublin (IE)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 16/291,709

(22) Filed: Mar. 4, 2019

(65) Prior Publication Data
US 2019/0288650 A1 Sep. 19, 2019

Related U.S. Application Data

(60) Provisional application No. 62/643,583, filed on Mar. 15, 2018.

(51) Int. Cl.
*H03F 9/00* (2006.01)
*H03F 1/56* (2006.01)
*H03F 3/45* (2006.01)
*H03F 3/20* (2006.01)

(52) U.S. Cl.
CPC ............. *H03F 1/565* (2013.01); *H03F 3/20* (2013.01); *H03F 3/45* (2013.01); *H03F 2200/451* (2013.01)

(58) Field of Classification Search
CPC ...................................................... H03F 9/00
USPC ................................................. 330/165, 276
See application file for complete search history.

(56) References Cited

U.S. PATENT DOCUMENTS

| | | | |
|---|---|---|---|
| 9,831,847 B2 * | 11/2017 | Babaie | H01F 27/2823 |
| 10,263,568 B2 * | 4/2019 | Harrison | H03F 3/21 |
| 2020/0025602 A1 * | 1/2020 | Tagliavini | G01G 23/363 |

OTHER PUBLICATIONS

Babaie, M. et al., "A Fully Integrated Bluetooth Low-Energy Transmitter in 28 nm CMOS With 36% System Efficiency at 3 dBm", IEEE Journal of Solid-State Circuits, Jul. 2016, 51(7):1547-1565.

* cited by examiner

Primary Examiner — Henry Choe
(74) Attorney, Agent, or Firm — Duane Morris LLP

(57) ABSTRACT

Systems and methods for suppressing and mitigating harmonic distortion in a circuit are disclosed. In one example, a disclosed circuit includes a radio frequency (RF) oscillator and a power amplifier. The RF oscillator is configured to generate an RF signal. The power amplifier is configured to generate an amplified RF signal based on the RF signal. The power amplifier includes a transformer including a primary winding and a secondary winding, and a feedback capacitor electrically coupled to the primary winding and the secondary winding.

17 Claims, 9 Drawing Sheets

SYSTEMS AND METHODS FOR SUPPRESSING AND MITIGATING HARMONIC DISTORTION IN A CIRCUIT

CROSS-REFERENCE TO RELATED APPLICATION

The present application claims priority to U.S. Provisional Patent Application No. 62/643,583, filed on Mar. 15, 2018, which is incorporated by reference herein in its entirety.

BACKGROUND

Ultra-low power (ULP) radios underpin short-range communications for wireless Internet of Things (IoT). Yet, the lifetime of an IoT system still tends to be severely limited by a transmitter power consumption and available battery technology. A radio frequency (RF) transmitter, e.g. a ULP transmitter, usually includes a phase locked loop (PLL) that generates an output signal associated with a phase related to a phase of an input signal.

A PLL, e.g. an all-digital PLL, may employ a digitally controlled oscillator (DCO) with a digital power amplifier (DPA) for switching current sources to reduce supply voltage and power without sacrificing its startup margin. When the DPA has a harmonic distortion at a frequency similar to the operating frequency of the DCO, injection pulling occurs at the DCO to pull its operating frequency with the harmonic distortion. As such, the efficiency of an RF transmitter including a DCO and a DPA will be hurt by the harmonic distortion as well as the injection pulling.

Thus, conventional transmitter circuits are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout specification and drawings.

DETAILED DESCRIPTION

Figure 1:
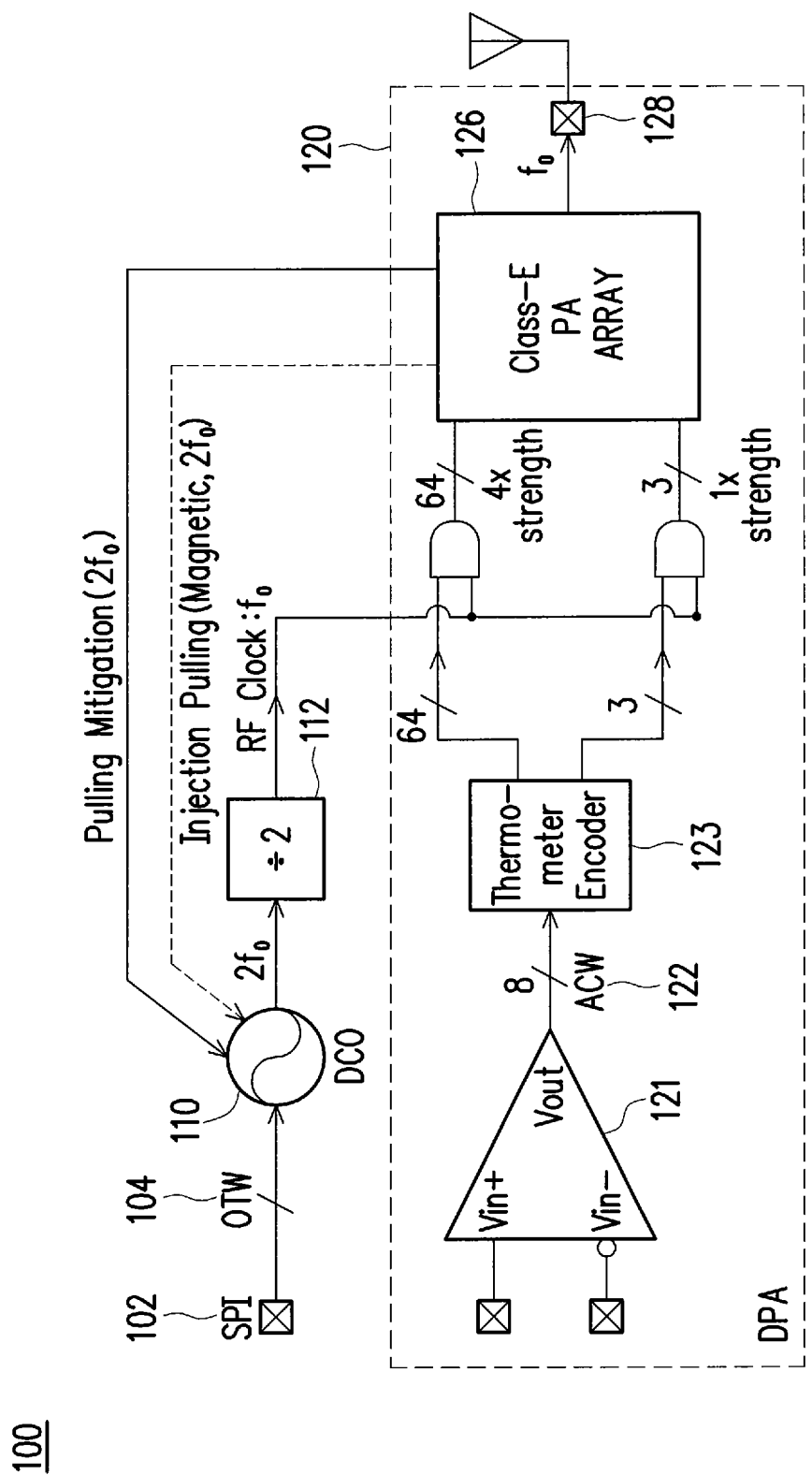
FIG. 1 illustrates a portion of an exemplary radio frequency (RF) circuit including a digitally controlled oscillator (DCO) and a digital power amplifier (DPA), in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Digitally controlled oscillator (DCO) and digital power amplifier (DPA) are common components in a radio frequency (RF) circuit. When both components are coupled in the circuit, the DPA may emit a harmonic at a frequency similar to the operating frequency of the DCO, which causes injection pulling or even injection locking at the DCO.

The present disclosure aims at reducing or removing the injection pulling at the oscillator to enable the circuit to operate in low supply voltage and easily overcome process variation. In one embodiment, a disclosed circuit includes a power amplifier having a capacitor and a matching network transformer operating in an inverting configuration. The capacitor is electrically coupled between a primary winding and a secondary winding of the matching network transformer. Serving as a feedback capacitor, the capacitor can enhance a feedback coupling from the secondary winding to the primary winding at a harmonic, to suppress or cancel an emission of harmonic distortion at this harmonic, thereby mitigating an injection pulling at an oscillator in the circuit.

In another embodiment, the oscillator comprises a coil magnetically coupled between the primary winding and the secondary winding of the power amplifier to sense the coupling and to send an amplified but inverted signal back to the windings to cancel or compensate the harmonic injection into the oscillator. The compensating strength of the coil may be controlled by a bias voltage to make the magnetic coupling factor between the power amplifier, and the oscillator at the harmonic below a certain threshold. For example, the harmonic may be a second-order harmonic or a third-order harmonic.

The present disclosure is applicable to all kinds of circuits including a phase locked loop and/or a frequency synthesizer. The disclosed solution can save circuit area with an easy implementation and porting scheme.

FIG. 1 illustrates a portion of an exemplary radio frequency (RF) circuit 100 including a digitally controlled oscillator (DCO) 110 and a digital power amplifier (DPA) 120, in accordance with some embodiments of the present disclosure. As shown in FIG. 1, the exemplary RF circuit 100 includes a serial peripheral interface (SPI) 102, the DCO 110, a frequency divider 112, and the DPA 120.

The DCO 110 in this example may receive an oscillator tuning word OTW 104 through the SPI 102, e.g. from a control word generator (not shown in FIG. 1). According to the oscillator tuning word OTW 104, the DCO 110 may generate an oscillator signal, e.g. a radio frequency (RF) signal for transmission. In some embodiments, the oscillator tuning word OTW 104 provides a corresponding operating voltage to control the frequency of the oscillator signal. Thus, the DCO 110 is configured to vary a frequency of the oscillator signal based upon the oscillator tuning word OTW. For a PLL, over a plurality of clock cycles, the oscillator tuning word OTW 104 drives the circuit 100 to enter a locked state by minimizing a phase error signal. The output oscillator signal in this example has a frequency of $2f_0$.

In some embodiments, the frequency divider 112 is configured to divide the frequency of the oscillator signal to output a down-divided oscillator signal. In this example, the frequency divider 112 divides the frequency $2f_0$ of the oscillator signal by two to output the down-divided oscillator signal with a frequency of $f_0$. For example, when the frequency of the oscillator signal is around 1.8 GHz, the frequency of the down-divided oscillator signal is around 0.9 GHz. An input terminal of the frequency divider 112 is electrically coupled to the output terminal of the DCO 110 to receive the oscillator signal. An output terminal of the frequency divider 112 is electrically coupled to the DPA 120. The down-divided oscillator signal may serve as an RF clock signal for the DPA 120.

The DPA 120 in this example is configured to generate an output signal at an output node 128 according to the down-divided oscillator signal. The DPA 120 in this example includes an op-amp comparator 121, a thermometer encoder 123, and a power amplifier (PA) array 126, e.g. a class-E PA array. The op-amp comparator 121 may compare two input voltage signals to generate a low-voltage differential signaling (LVDS) output as an amplitude control word ACW 122. The op-amp comparator 121 outputs the amplitude control word ACW 122 to the thermometer encoder 123 for encoding. In one embodiment, the DPA 120 may be a single-ended differential DPA.

The thermometer encoder 123 in this example receives and encodes the amplitude control word ACW 122 from the op-amp comparator 121. The thermometer encoder 123 serves as a modulator to generate digital signals to control the PA array 126 to adjust the amplitude of the output signal at the output node 128. The op-amp comparator 121 and the thermometer encoder 123 form an analog-to-digital converter (ADC). The thermometer encoder 123 generates an encoded ACW at different tuning strengths. The encoded ACW may be used to coarse-tune and fine-tune the amplitude of the output signal of the PA array 126. The thermometer encoder 123 may send both the coarse-tuning signal and the fine-tuning signal to the PA array 126 for power amplification.

The PA array 126 in this example receives the coarse-tuning signal and the fine-tuning signal from the thermometer encoder 123 and receives the RF clock signal of frequency $f_0$ from the frequency divider 112. The output signal of the PA array 126, i.e. the output signal of the DPA 120 at the output node 128, may be an amplified signal of the down-divided oscillator signal and have a same fundamental frequency $f_0$ as that of the down-divided oscillator signal or the RF clock signal. But when a power amplifier amplifies a signal, in addition to the fundamental frequency, harmonics (e.g. second-order harmonic $2f_0$ or third-order harmonic $3f_0$) may also be amplified, which can cause harmonic distortion (HD) emission from the DPA 120 to the DCO 110 by an injection pulling due to a magnetic coupling between the DCO 110 and the DPA 120. For example, if the DPA 120 emits a second-order harmonic distortion (HD2) at the frequency $2f_0$ from a matching network transformer inside the DPA 120, an injection pulling may occur at the DCO 110 whose internal transformer also works around the frequency $2f_0$. To avoid this injection pulling, a pulling mitigation mechanism is added in the exemplary RF circuit 100, with respect to the HD2 at the frequency $2f_0$. In various embodiments, the pulling mitigation mechanism may work for a circuit including any oscillator and any power amplifier. In various embodiments, the pulling mitigation mechanism may mitigate injection pulling for harmonic distortions other than HD2 as well.

As an example of the pulling mitigation mechanism, the PA array 126 may comprise a transformer and a feedback capacitor. The transformer includes a primary winding and a secondary winding. The feedback capacitor is electrically coupled to the primary winding and the secondary winding, to enhance a feedback coupling from the secondary winding to the primary winding to suppress at least one harmonic distortion, e.g. a second-order harmonic distortion (HD2), of the amplified RF signal generated by the PA array 126.

Figure 2:
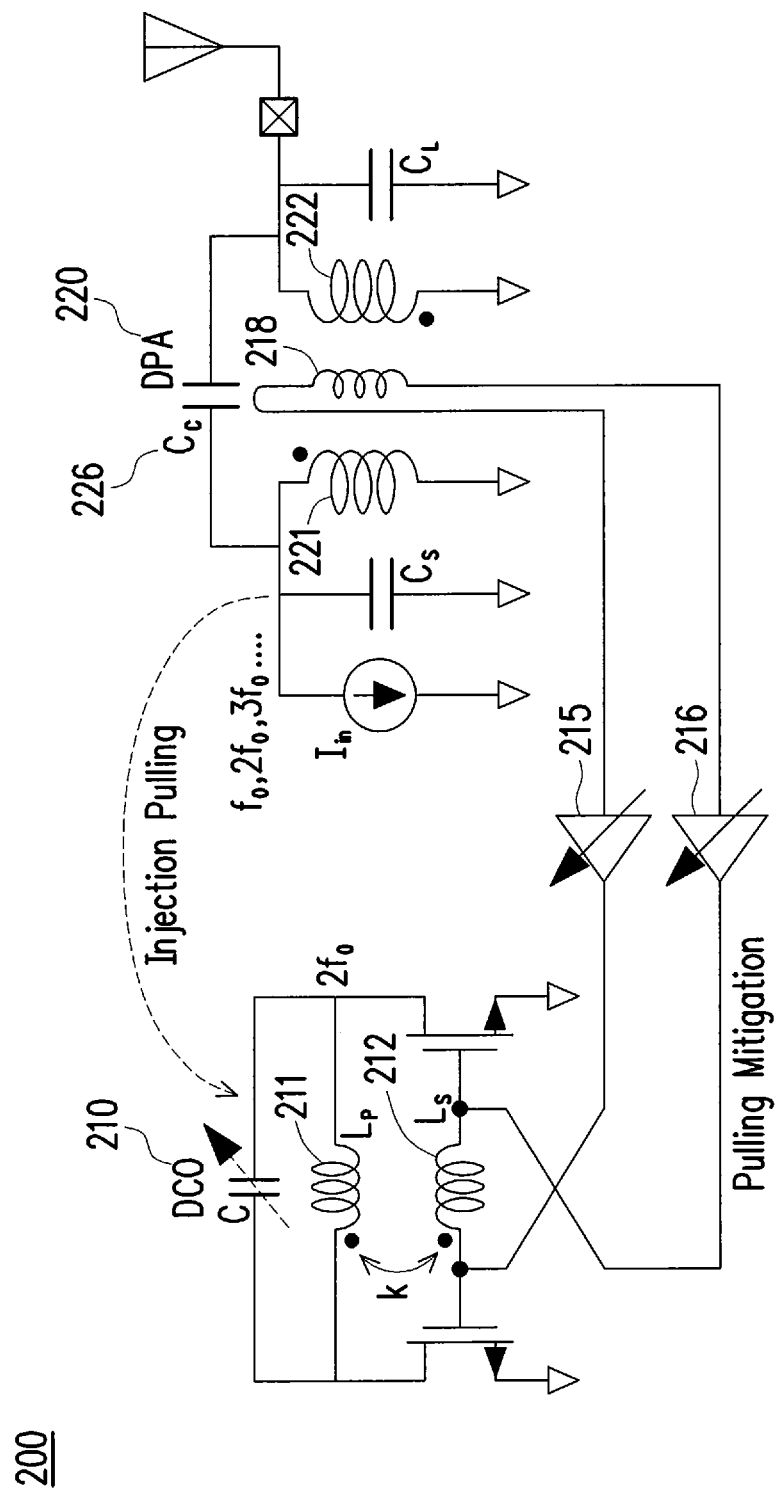
FIG. 2 illustrates an interaction between a DCO and a DPA of an exemplary RF circuit, in accordance with some embodiments of the present disclosure.

FIG. 2 illustrates an interaction between a DCO 210 and a DPA 220 of an exemplary RF circuit 200, in accordance with some embodiments of the present disclosure. In one embodiment, the DCO 210 and the DPA 220 are coupled to each other as the DCO 110 and the DPA 120 in FIG. 1. As shown in FIG. 2, the DCO 210 in this example includes a transformer having a primary winding 211 and a secondary winding 212; and the DPA 220 in this example includes a transformer having a primary winding 221 and a secondary winding 222. Because the two transformers are located close to each other in the exemplary RF circuit 200, they can be coupled to each other magnetically, which may cause an injection pulling at the DCO 210. For example, the DCO 210 operates at the frequency $2f_0$, and sends an RF clock signal at the frequency $f_0$ through a divider to the DPA 220 for amplification. After the DPA 220 amplifies the RF clock signal, the amplified signal may have harmonics, e.g. the second-order harmonic at the frequency $2f_0$, the third-order harmonic at the frequency $3f_0$, etc., in addition to the fundamental frequency $f_0$. Because the DPA 220 is located close to the DCO 210 and because the second-order harmonic $2f_0$ is same as the operating frequency of the DCO 210, the component of the amplified signal at the frequency $2f_0$ can cause injection pulling at the DCO 210 through the magnetic coupling between the two transformers of the DCO 210 and the DPA 220.

As shown in FIG. 2, one possible pulling mitigation mechanism is based on a feedback capacitor 226 that is electrically coupled to the primary winding 221 and the secondary winding 222 of the matching network transformer in the DPA 220. In one embodiment, the feedback capacitor 226 enhances a feedback coupling from the secondary winding 222 to the primary winding 221 of the matching network transformer at the second-order harmonic $2f_0$ to cancel or at least suppress the HD2 emission from the DPA 220. In one embodiment, the matching network including the primary winding 221 and the secondary winding 222 has a loaded quality factor (Q-factor) that is high enough such that a third-order harmonic distortion (HD3) emission is also suppressed below a given threshold due to a filtering function of the matching network.

As shown in FIG. 2, another possible pulling mitigation mechanism is based on a coil or winding 218 that is magnetically coupled between the primary winding 221 and the secondary winding 222 of the matching network transformer in the DPA 220. The coil 218 is electrically coupled to the DCO 210 and is controlled by tunable bias 215, 216 associated with the coil 218. A bias voltage of the tunable bias 215, 216 may be controlled based on the coil 218's sensing of the coupling between the primary winding 221 and the secondary winding 222. By controlling the bias voltage, the DCO 210 can send an amplified but inverted signal back to the primary winding 221 and the secondary winding 222, through the coil 218, to cancel or suppress the harmonic distortion from the DPA 220. In addition, by controlling the bias voltage based on the sensed information at the coil 218, a coupling factor between the DCO 210 and the DPA 220 becomes small, i.e. the injection pulling from the DPA 220 to the DCO 210 is mitigated.

Figure 3A:
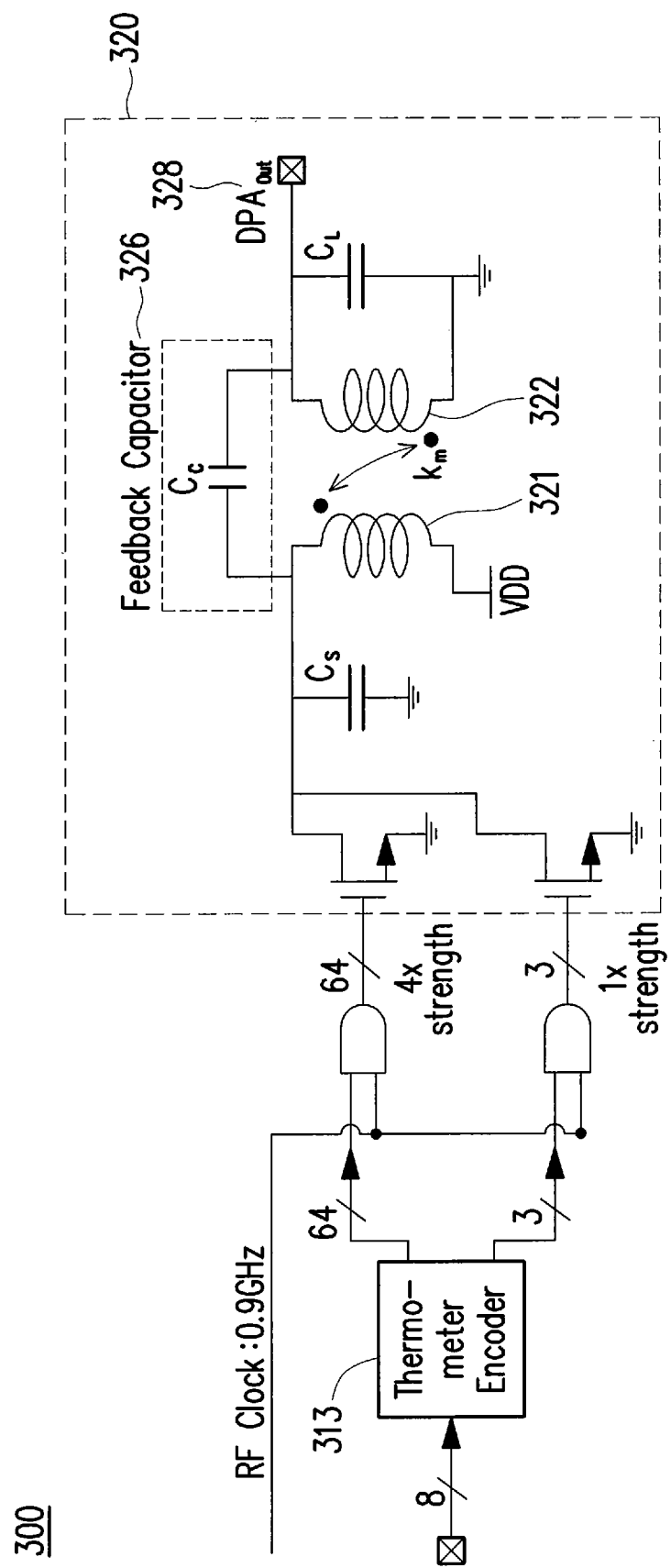
FIG. 3A illustrates a feedback capacitor in a single-ended DPA of an exemplary RF circuit, in accordance with some embodiments of the present disclosure.

FIG. 3A illustrates a feedback capacitor 326 in a single-ended DPA 300 of an exemplary RF circuit, in accordance with some embodiments of the present disclosure. In an embodiment shown in FIG. 3A, the RF circuit utilizes the feedback capacitor 326 to cancel or suppress harmonic distortion from the single-ended DPA 300. In this example, the single-ended DPA 300 includes a PA array circuit 320 that has a single end output 328.

The thermometer encoder 313 in this example generates an encoded amplitude control word ACW and sends to the PA array circuit 320. The PA array circuit 320 receives the encoded amplitude control word ACW from the thermometer encoder 313, and receives an RF clock signal having a frequency of a 0.9 GHz from e.g. a DCO. Based on different tuning strengths, the PA array circuit 320 can amplify the RF clock signal to generate an amplified RF signal at the single end output 328. The feedback capacitor 326 in the PA array circuit 320 is electrically coupled between a primary winding 321 and a secondary winding 322 of the PA array circuit 320. As discussed above, the feedback capacitor 326 in the PA array circuit 320 can help to enhance the coupling factor km between the primary winding 321 and the secondary winding 322, to cancel or suppress a harmonic distortion emitted by the single-ended DPA 300. A detailed description of the simple feedback coupling cancellation (FBCC) is provided below with respect to FIG. 3B.

Figure 3B:
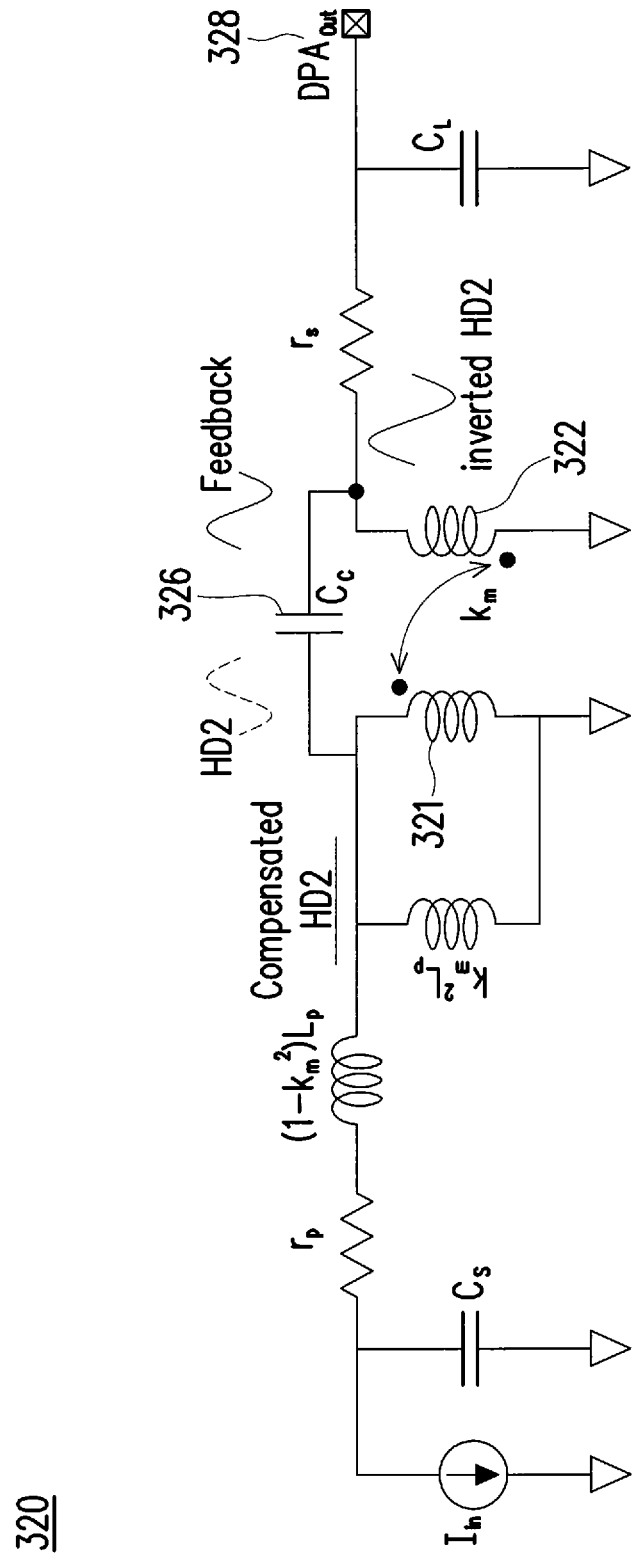
FIG. 3B illustrates functions performed by a single-ended DPA having a feedback capacitor in an exemplary RF circuit, in accordance with some embodiments of the present disclosure.

FIG. 3B illustrates functions performed by a single-ended DPA, e.g. the single-ended DPA 300 in FIG. 3A, having a feedback capacitor 326 in an exemplary RF circuit, in accordance with some embodiments of the present disclosure. In an example as shown in FIG. 3B, the feedback capacitor 326 receives an HD2 signal represented by a sinusoidal wave from the side of the primary winding 321 and generates an inverted HD2 signal represented by an inverted sinusoidal wave at the side of the secondary winding 322. The inverted HD2 signal is sent back as a feedback to the side of the primary winding 321, via the coupling between the primary winding 321 and the secondary winding 322, to compensate or cancel the original HD2 signal. In an ideal case, the compensated HD2 signal will have no amplitude component at the HD2 frequency, i.e. total cancellation of HD2 at the single end output 328.

Figure 3C:
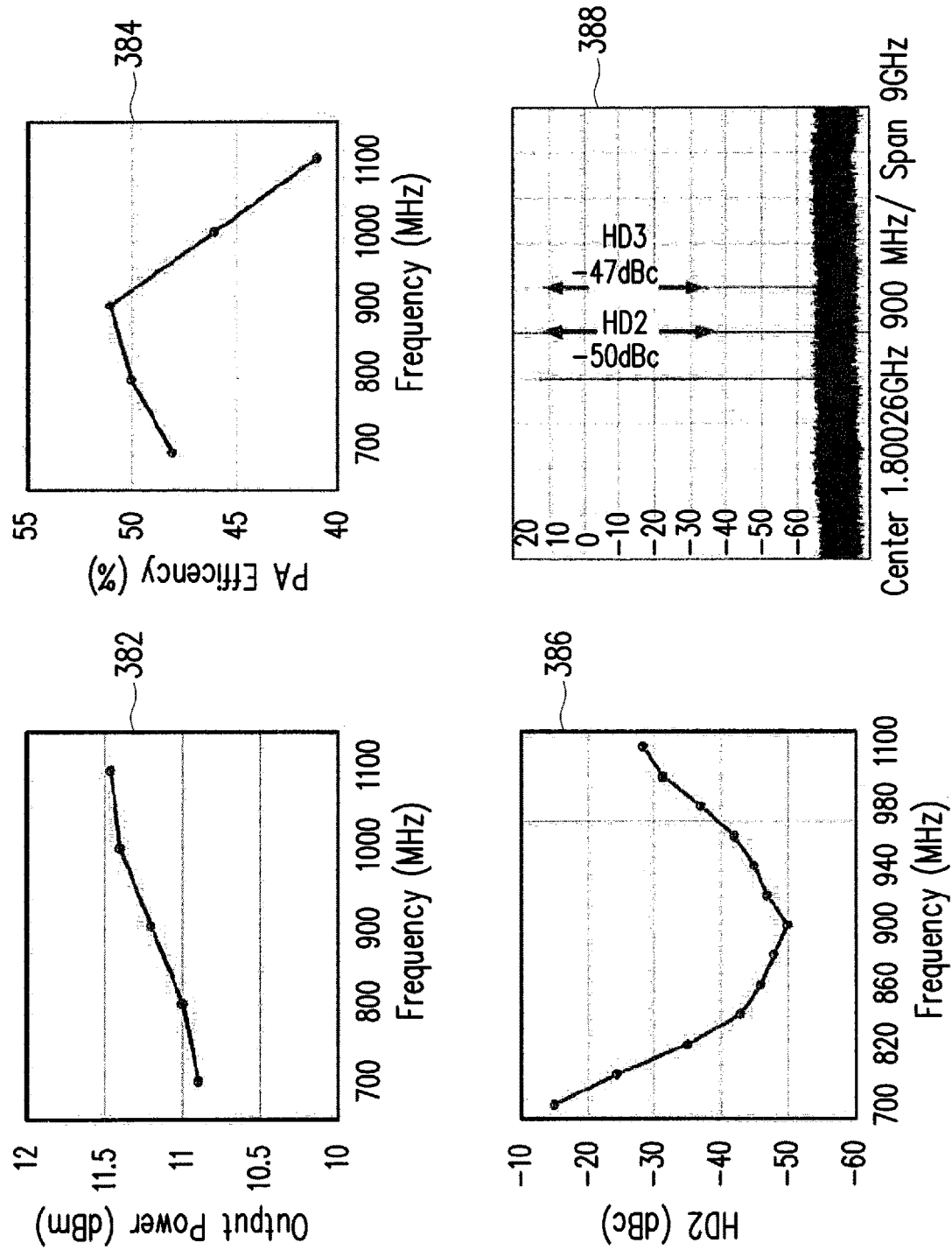
FIG. 3C illustrates performances of a single-ended DPA having a feedback capacitor in an exemplary RF circuit, in accordance with some embodiments of the present disclosure.

FIG. 3C illustrates performances of a single-ended DPA, e.g. the single-ended DPA 300 in FIG. 3A, having a feedback capacitor, e.g. the feedback capacitor 326 in FIG. 3A and FIG. 3B, in an exemplary RF circuit, in accordance with some embodiments of the present disclosure. As shown in FIG. 3C, the output power 382 at the single end output 328 of the single-ended DPA 300 is more than 11 dBm at the fundamental frequency 900 MHz. The PA efficiency 384 of the single-ended DPA 300 is highest at the fundamental frequency 900 MHz. In addition, the HD2 power 386 is lowest when the fundamental frequency is at 900 MHz. Specifically, the harmonic distortion emission performance 388 is shown with a bias voltage equal to 0, i.e. no compensating path with extra coil other than the feedback capacitor 326 or compensating path turned off. With a fundamental frequency 900 MHz, the HD2 emission at frequency 1.8 GHz is suppressed to −50 dBc, and the HD3 emission at frequency 2.7 GHz is suppressed to −47 dBc, without any calibration.

Figure 4A:
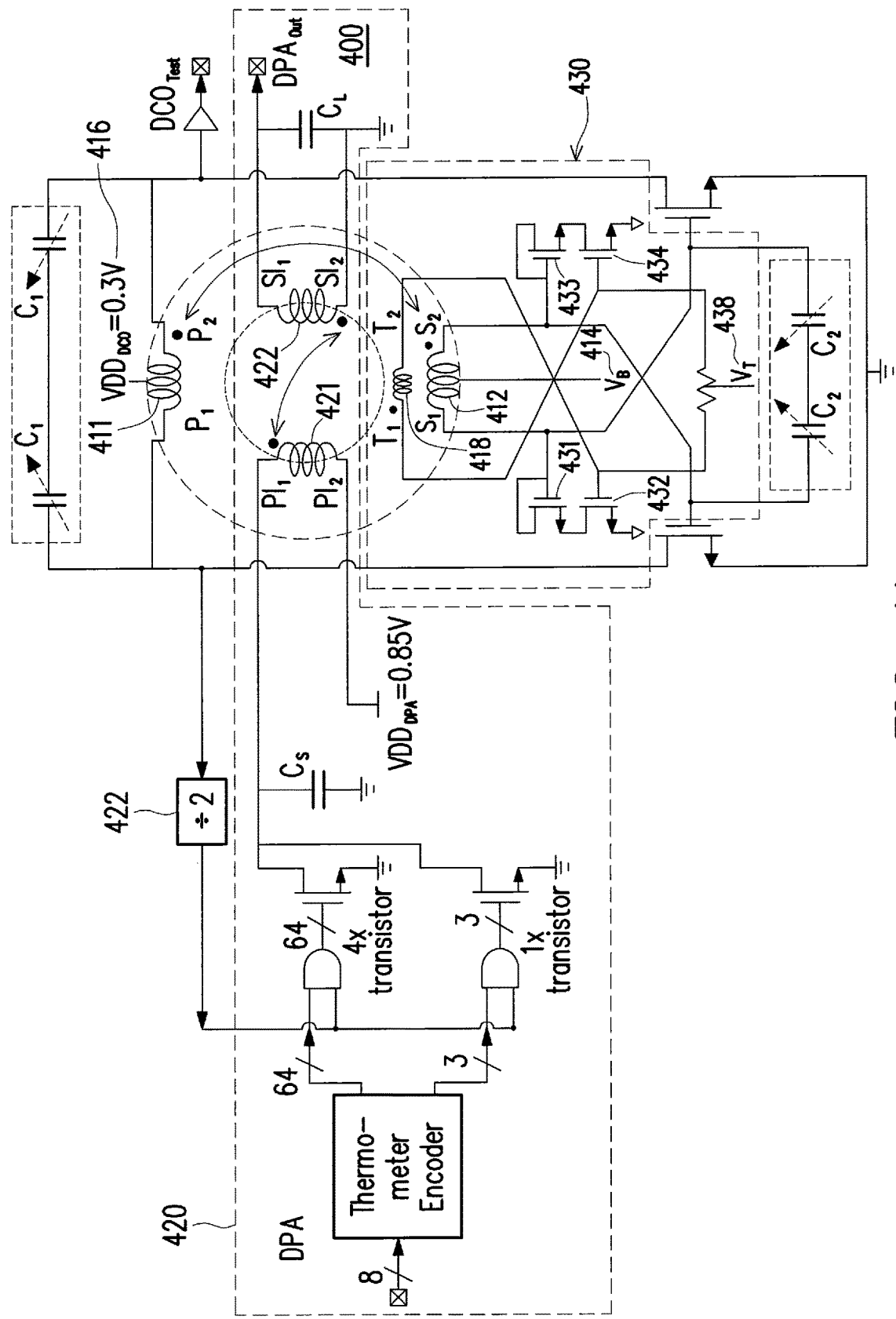
FIG. 4A illustrates a mitigation of injection pulling from a DPA to a DCO in an exemplary RF circuit, in accordance with some embodiments of the present disclosure.

FIG. 4A illustrates a mitigation of injection pulling from a DPA to a DCO in an exemplary RF circuit 400, in accordance with some embodiments of the present disclosure. As shown in FIG. 4A, the exemplary RF circuit 400 includes a DPA 420, a divider 422, and a DCO. The DCO in FIG. 4A covers all components other than those of the divider 422 and the DPA 420. The DCO includes a DCO transformer having a primary winding 411 and a secondary winding 412 that are magnetically coupled to each other. In this example, the primary winding 411 is coupled to a power supply voltage VDD of 0.3 V; the secondary winding 412 is coupled to a bias voltage $V_B$.

The divider 422 is coupled between the DCO and the DPA 420. As discussed above, after the DCO generates an oscillator signal, e.g. at a frequency of 1.8 GHz, the divider 422 divides the frequency of the oscillator signal to generate a clock signal having an average frequency representing a frequency of the oscillator signal divided by two. The DPA 420 is configured to generate an amplified RF signal having a fundamental frequency 0.9 GHz based on the clock signal from the divider 422.

The DPA 420 in this example includes a DPA transformer having a primary winding 421 and a secondary winding 422 that are magnetically coupled to each other. While the DPA transformer including the primary winding 421 and the secondary winding 422 operates at the fundamental frequency 0.9 GHz, its HD2 emission is at the frequency 1.8 GHz that is the same as the operating frequency of the DCO transformer including the primary winding 411 and the secondary winding 412.

To mitigate the injection pulling from the DPA transformer to the DCO transformer at the HD2 frequency and/or other harmonic frequencies, the DCO also includes a compensating circuit 430 including or coupled to a coil 418. The coil 418 is magnetically coupled between the primary winding 421 and the secondary winding 422 to sense the coupling of the DPA transformer. The compensating circuit 430 controls a bias voltage $V_T$ 438 associated with the coil 418, e.g. based on the sensing result of the coil 418, to mitigate a magnetic coupling with respect to at least one harmonic injection from the DPA to the DCO, e.g. by sending an amplified by inverted signal as a magnetic coupling feedback from the DCO to the DPA. In one embodiment, the at least one harmonic injection comprises a second-order harmonic injection to the DCO.

In this example, the compensating circuit 430 further comprises: a first pair of transistors 432, 434 whose gates are coupled to two ends of the coil 418 respectively; and a second pair of transistors 431, 433 whose gates are coupled to two ends of the secondary winding 412 respectively. The transistor 431 and the transistor 432 are connected in series. The transistor 433 and the transistor 433 are connected in series. Without a feedback capacitor, the exemplary RF circuit 400 in this example utilizes the sensing coil 418 and the compensating circuit 430 to mitigate the DPA-induced injection pulling at the DCO, through a magnetic coupling feedback from the DCO to the DPA controlled by the bias voltage $V_T$ 438. For example, by controlling the bias voltage $V_T$ 438, the voltage and the inductance of the coil 418 may be tuned to impact the coupling factor between the DCO transformer (including the primary winding 411 and the secondary winding 412) and the DPA transformer (including the primary winding 421 and the secondary winding 422), by sending a magnetic coupling feedback to the DPA transformer from the coil 418. The injection pulling is mitigated when the coupling factor between the DCO transformer and the DPA transformer is controlled to be lower than a certain threshold.

Figure 4B:
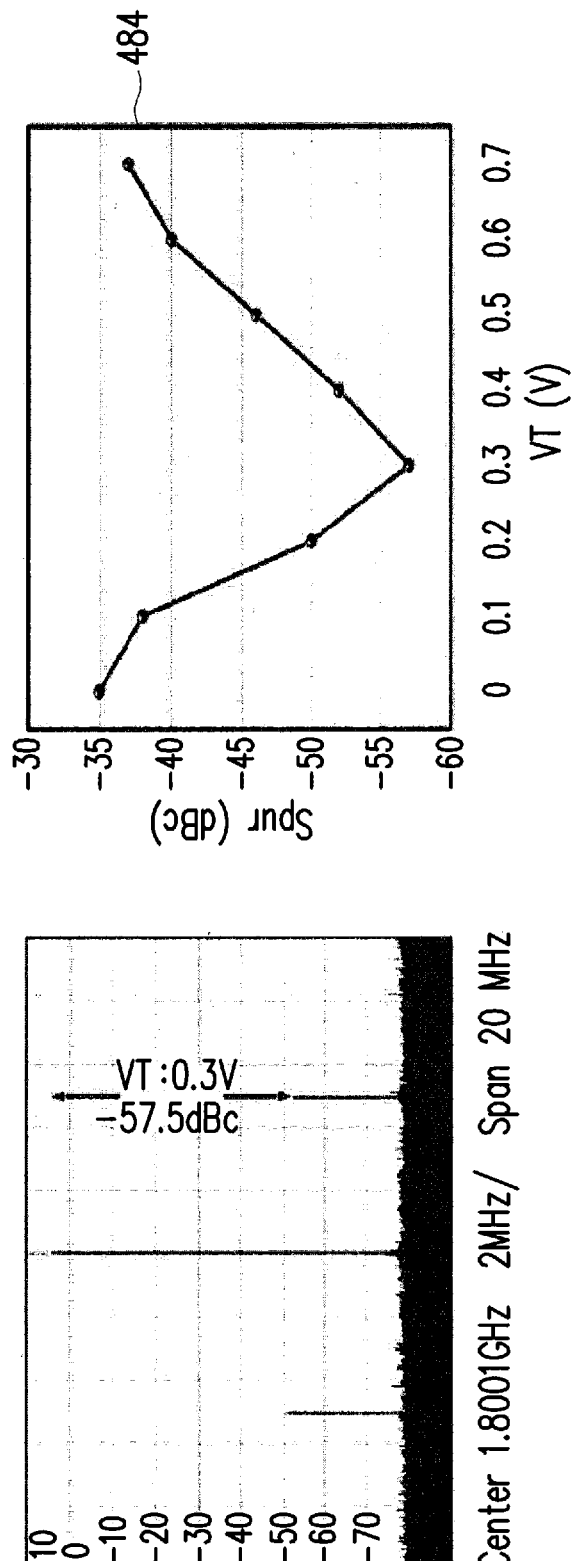
FIG. 4B illustrates performances of the injection pulling mitigation shown in FIG. 4A, in accordance with some embodiments of the present disclosure.

FIG. 4B illustrates performances of the injection pulling mitigation shown in FIG. 4A, in accordance with some embodiments of the present disclosure. As shown in FIG. 4B, the injection pulling spur 482 induced by the DPA at the DCO is mitigated to −57.5 dBc with a 5 MHz frequency offset and the bias voltage $V_T$ 438 tuned to 0.3 V. In this example, for different values of the bias voltage $V_T$ 438, the injection pulling spur (i.e. the injection pulled-back signal) 484 induced by the DPA at the DCO is minimized at 0.3 V.

Figure 5:
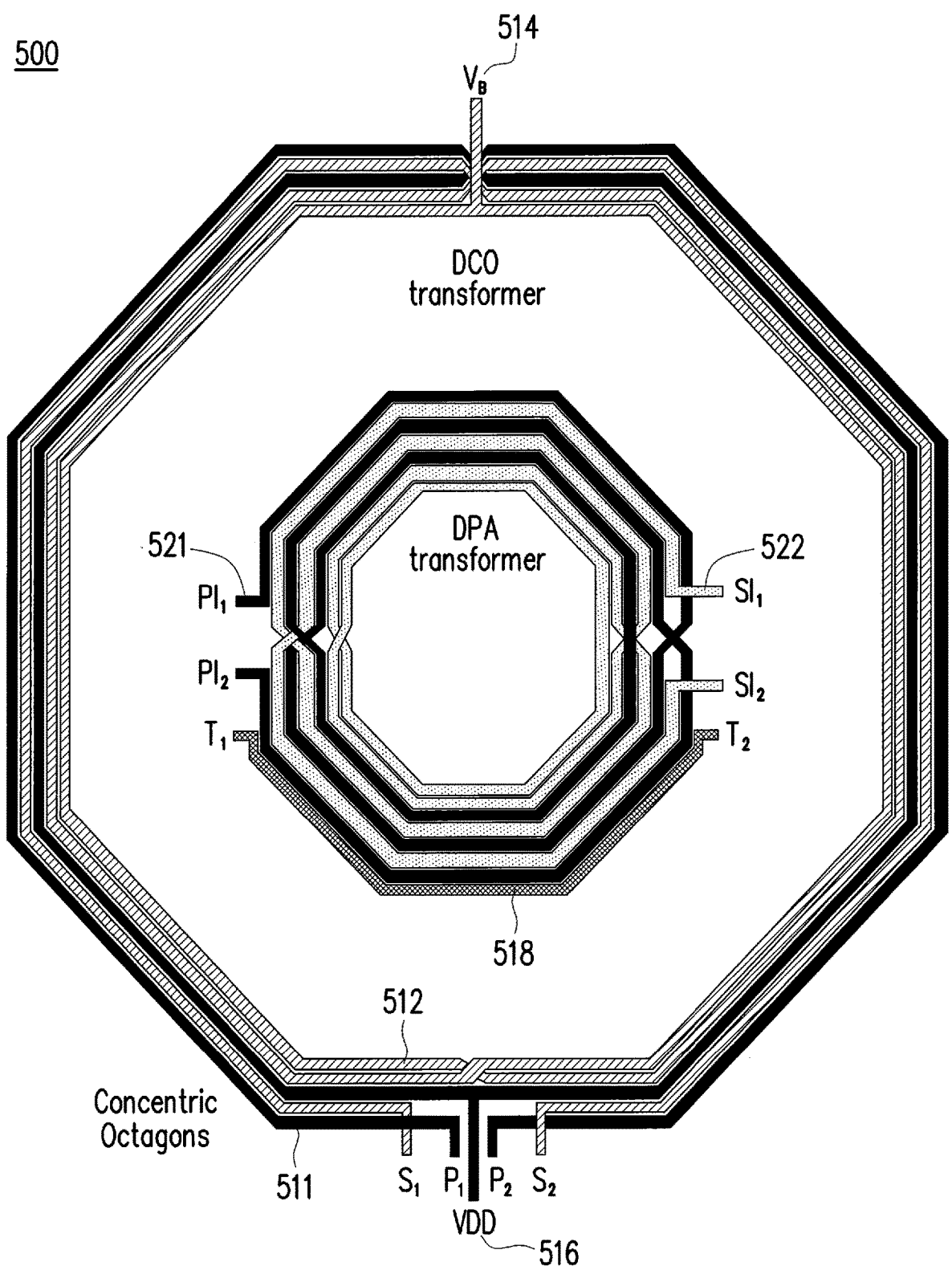
FIG. 5 illustrates a concentric octagon layout topology of an exemplary RF circuit including a DCO and a DPA, in accordance with some embodiments of the present disclosure.

FIG. 5 illustrates a concentric octagon layout topology 500 of an exemplary RF circuit including a DCO and a DPA, in accordance with some embodiments of the present disclosure. In this exemplary concentric octagon layout topology 500, the DPA transformer is placed within an inner diameter of the DCO transformer. The DPA transformer includes a primary winding 521 and a secondary winding 522, according to an octagon layout with a smaller size. The DCO transformer includes a primary winding 511 and a secondary winding 512, according to an octagon layout with a larger size. The larger octagon layout is outside and concentric to the smaller octagon layout of the DPA transformer. The primary winding 511 is coupled to a power supply voltage VDD 516. The secondary winding 512 is coupled to a bias voltage $V_B$ 514.

In this example, the DCO transformer is electrically coupled to a coil 518. The coil 518 is placed between the primary winding 521 and the secondary winding 522 of the DPA transformer in the smaller octagon layout. The coil 518 is magnetically coupled to the primary winding 521 and the secondary winding 522, and can sense the coupling of the DPA transformer to send an amplified but inverted signal back to the DPA transformer windings to cancel or mitigate the HD2 injected into the DCO.

In one embodiment, a minimum distance is reserved between an outmost turn of the DPA transformer and an innermost turn of the DCO transformer to keep a coupling factor at a certain harmonic between the DPA and the DCO below a given threshold.

Figure 6:
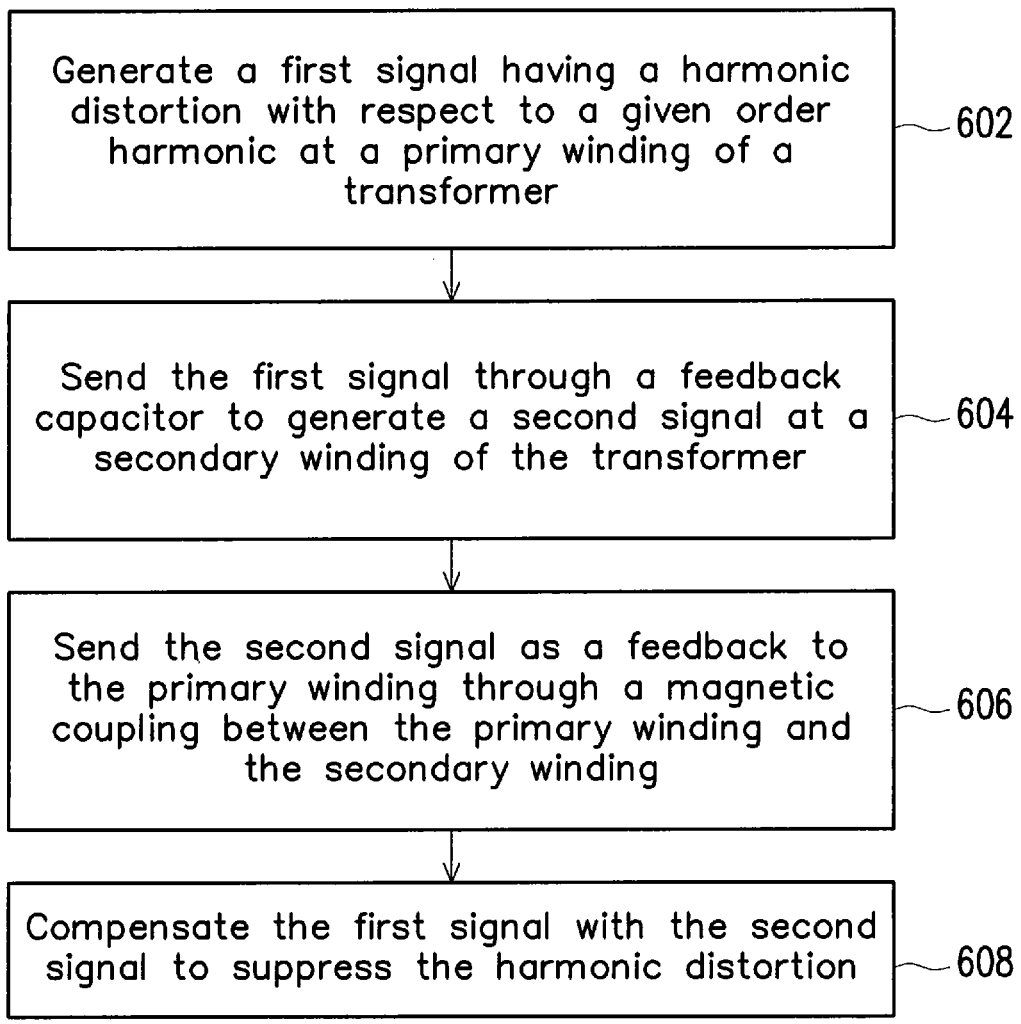
FIG. 6 illustrates an exemplary method for suppressing a harmonic distortion emitted by a power amplifier, in accordance with some embodiments of the present disclosure.

FIG. 6 illustrates an exemplary method 600 for suppressing a harmonic distortion emitted by a power amplifier having a transformer, in accordance with some embodiments of the present disclosure. As shown in FIG. 6, a first signal having a harmonic distortion with respect to a given order harmonic is generated at operation 602 at a primary winding of the transformer. The first signal is sent at operation 604 through the feedback capacitor to generate a second signal at a secondary winding of the transformer. The given order harmonic of the second signal is an inversion of the given order harmonic of the first signal. The second signal is sent at operation 606 as a feedback to the primary winding through a magnetic coupling between the primary winding and the secondary winding. The first signal is compensated at operation 608 with the second signal to suppress the harmonic distortion.

It can be understood that the order of the steps shown in FIG. 6 may be changed according to different embodiments of the present disclosure.

In an embodiment, a circuit is disclosed. The circuit includes: a radio frequency (RF) oscillator and a power amplifier. The RF oscillator is configured to generate an RF signal. The power amplifier is configured to generate an amplified RF signal based on the RF signal. The power amplifier includes a transformer including a primary winding and a secondary winding, and a feedback capacitor electrically coupled to the primary winding and the secondary winding.

In another embodiment, a circuit is disclosed. The circuit includes: a radio frequency (RF) oscillator and a power amplifier. The RF oscillator is configured to generate an RF signal. The power amplifier is configured to generate an amplified RF signal based on the RF signal. The power amplifier includes a first transformer including a first primary winding and a first secondary winding. The RF oscillator comprises a coil magnetically coupled between the first primary winding and the first secondary winding.

In yet another embodiment, a method for suppressing harmonic distortions of a power amplifier comprising a transformer and a feedback capacitor is disclosed. The method includes: generating a first signal having a harmonic distortion with respect to a given order harmonic at a primary winding of the transformer; sending the first signal through the feedback capacitor to generate a second signal at a secondary winding of the transformer, wherein the given order harmonic of the second signal is an inversion of the given order harmonic of the first signal; sending the second signal as a feedback to the primary winding through a magnetic coupling between the primary winding and the secondary winding; and compensating the first signal with the second signal to suppress the harmonic distortion.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A circuit, comprising:
a radio frequency (RF) oscillator configured to generate an RF signal;

a power amplifier configured to generate an amplified RF signal based on the RF signal, wherein the power amplifier comprises:
a transformer including a primary winding and a secondary winding, and
a feedback capacitor electrically coupled to the primary winding and the secondary winding; and
a frequency divider that is coupled between the RF oscillator and the power amplifier, wherein:
the frequency divider is configured to generate a clock signal having an average frequency representing a frequency of the RF signal divided by two, and
the power amplifier is configured to generate the amplified RF signal based on the clock signal.

2. The circuit of claim 1, wherein:
the RF oscillator is a digitally controlled oscillator (DCO) that generates the RF signal according to an oscillator tuning word; and
the power amplifier is a single-ended differential digital power amplifier (DPA).

3. The circuit of claim 1, wherein the feedback capacitor enhances a feedback coupling from the secondary winding to the primary winding to suppress at least one harmonic distortion of the amplified RF signal.

4. The circuit of claim 3, wherein the at least one harmonic distortion comprises a second-order harmonic distortion (HD2) of the amplified RF signal.

5. The circuit of claim 3, wherein the power amplifier comprises a matching network having a loaded quality factor that is high enough such that a third-order harmonic distortion (HD3) of the amplified RF signal is suppressed below a given threshold by the feedback capacitor.

6. The circuit of claim 1, wherein the transformer of the power amplifier is placed within an inner diameter of a transformer of the RF oscillator according to a concentric layout topology.

7. The circuit of claim 1, the RF oscillator comprises a coil magnetically coupled between the primary winding and the secondary winding.

8. A circuit, comprising:
a radio frequency (RF) oscillator configured to generate an RF signal; and
a power amplifier configured to generate an amplified RF signal based on the RF signal, wherein:
the power amplifier comprises a first transformer including a first primary winding and a first secondary winding,
the RF oscillator comprises a coil magnetically coupled between the first primary winding in the power amplifier and the first secondary winding in the power amplifier,
the RF oscillator further comprises a compensating circuit coupled to the coil and configured to control a bias voltage associated with the coil, and
the bias voltage is controlled to mitigate a magnetic coupling with respect to at least one harmonic injection from the power amplifier to the RF oscillator.

9. The circuit of claim 8, wherein:
the RF oscillator is a digitally controlled oscillator (DCO) that generates the RF signal according to an oscillator tuning word; and
the power amplifier is a single-ended differential digital power amplifier (DPA).

10. The circuit of claim 8, wherein the at least one harmonic injection comprises a second-order harmonic injection to the RF oscillator.

11. The circuit of claim 10, further comprising a frequency divider that is coupled between the RF oscillator and the power amplifier and configured to generate a clock signal having an average frequency representing a frequency of the RF signal divided by two, wherein the power amplifier is configured to generate the amplified RF signal based on the clock signal.

12. The circuit of claim 8, wherein the RF oscillator further comprises a second transformer including a second primary winding and a second secondary winding.

13. The circuit of claim 12, wherein the compensating circuit comprises:
a first pair of transistors whose gates are coupled to two ends of the coil respectively; and
a second pair of transistors whose gates are coupled to two ends of the second secondary winding respectively, wherein each of the second pair of transistors is connected to a respective one of the first pair of transistors in series.

14. The circuit of claim 12, wherein:
the first transformer of the power amplifier is placed within an inner diameter of the second transformer of the RF oscillator according to a concentric layout topology; and
a minimum distance is reserved between an outmost turn of the first transformer and an innermost turn of the second transformer to keep a coupling factor at a certain harmonic between the power amplifier and the RF oscillator below a given threshold.

15. A method for suppressing harmonic distortions of a power amplifier comprising a transformer and a feedback capacitor, comprising:
generating a first signal having a harmonic distortion with respect to a given order harmonic at a primary winding of the transformer;
sending the first signal through the feedback capacitor to generate a second signal at a secondary winding of the transformer, wherein the given order harmonic of the second signal is an inversion of the given order harmonic of the first signal;
sending the second signal as a feedback to the primary winding through a magnetic coupling between the primary winding and the secondary winding; and
compensating the first signal with the second signal to suppress the harmonic distortion.

16. The method of claim 15, further comprising:
sensing the magnetic coupling between the primary winding and the secondary winding by a coil magnetically coupled between the primary winding and the secondary winding; and
sending, by the coil, an amplified and inverted signal to the primary winding and the secondary winding, wherein the coil is electrically coupled to an oscillator.

17. The method of claim 16, further comprising:
controlling a bias voltage associated with the coil to mitigate a magnetic coupling with respect to at least one harmonic injection from the power amplifier to the oscillator.

* * * * *